US012721099B2

(12) United States Patent
Watanabe et al.

(10) Patent No.: US 12,721,099 B2
(45) Date of Patent: Aug. 25, 2026

(54) WAFER PLACEMENT TABLE

(71) Applicant: NGK INSULATORS, LTD., Nagoya-City (JP)

(72) Inventors: Reo Watanabe, Handa-City (JP); Daisuke Tsunekawa, Handa-City (JP); Kanto Watanabe, Tsushima-City (JP)

(73) Assignee: NGK INSULATORS, LTD., Nagoya-City (JP)

( * ) Notice: Subject to any disclaimer, the term of this patent is extended or adjusted under 35 U.S.C. 154(b) by 648 days.

(21) Appl. No.: 18/298,404

(22) Filed: Apr. 11, 2023

(65) Prior Publication Data

US 2023/0402306 A1 Dec. 14, 2023

(30) Foreign Application Priority Data

Jun. 10, 2022 (JP) ................................ 2022-094256

(51) Int. Cl.
*H10P 72/30* (2026.01)
*H10P 72/70* (2026.01)

(52) U.S. Cl.
CPC .......... *H10P 72/3411* (2026.01); *H10P 72/70* (2026.01)

(58) Field of Classification Search
CPC ............. H01L 21/67778; H01L 21/683; H01L 21/67103; H01L 21/68785;
(Continued)

(56) References Cited

U.S. PATENT DOCUMENTS 8,075,756 B2 * 12/2011 Yoshioka ............... C25D 17/06 205/157
2008/0116187 A1 * 5/2008 Sugimoto .............. H05B 3/143 219/200
(Continued)

FOREIGN PATENT DOCUMENTS

CN 104995726 A * 10/2015 ............... G01K 7/02
CN 110291623 A * 9/2019 ........... H01L 21/324
(Continued)

OTHER PUBLICATIONS

Korean Office Action (with English translation) dated Jul. 24, 2024 (Application No. 10-2023-0051068).

*Primary Examiner* — Mohammed Shamsuzzaman
(74) *Attorney, Agent, or Firm* — Muncy, Geissler, Olds & Lowe, P.C.

(57) ABSTRACT

A wafer placement table includes: a ceramic substrate having a wafer placement surface and incorporating an electrode; a conductive embedded member electrically connected to the electrode; a conductive terminal with a female thread, the conductive terminal being electrically connected to the conductive embedded member, having a projection projecting from a surface, on an opposite side to the wafer placement surface, of the ceramic substrate, having the female thread at an end face of the projection; a conductive adapter that is mounted on the end face of the projection of the conductive terminal with the female thread, has a communication hole that communicates with the female thread, and is non-rotatable relative to the conductive terminal with the female thread; and a conductive connection member with a male thread, the conductive connection member having the male thread screwed into the female thread through the communication hole, and being integrated with the adapter.

6 Claims, 8 Drawing Sheets

(58) Field of Classification Search
CPC ............... H01L 21/68757; H05B 3/283; H10P 72/3411; H10P 72/70; H10P 72/0432; H10P 72/7616; H10P 72/7624
See application file for complete search history.

(56) References Cited

U.S. PATENT DOCUMENTS

| | | | | |
|---|---|---|---|---|
| 2009/0173449 | A1 | 7/2009 | Nakamura et al. | |
| 2021/0217613 | A1 * | 7/2021 | Wu | H01L 21/324 |
| 2022/0124875 | A1 * | 4/2022 | Iwata | H05B 1/0233 |

FOREIGN PATENT DOCUMENTS

| | | | | | |
|---|---|---|---|---|---|
| EP | 1283394 | A2 | * | 2/2003 | F23Q 7/001 |
| FR | 3003999 | A1 | * | 10/2014 | H01L 21/67103 |
| JP | 2004031596 | A | * | 1/2004 | H05B 3/68 |
| JP | 2005026082 | A | * | 1/2005 | H01L 21/68 |
| JP | 2009-188390 | A | | 8/2009 | |
| JP | 2022074997 | A | * | 5/2022 | H01L 21/67103 |
| KR | 10-2013-0136243 | A | | 12/2013 | |
| KR | 20130136243 | A | * | 12/2013 | H01L 21/67103 |
| KR | 101904490 | B1 | * | 10/2018 | H05B 3/08 |
| KR | 102254204 | B1 | * | 5/2021 | H05B 3/68 |

* cited by examiner

Fig. 5A
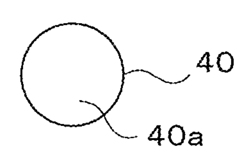
Fig. 5B
Fig. 5D
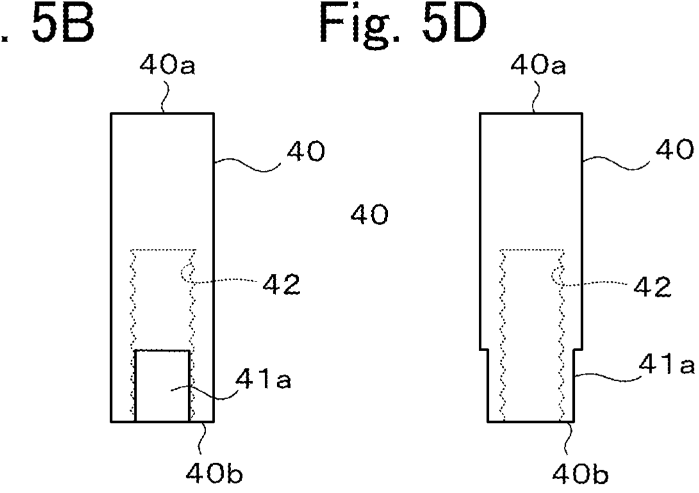
Fig. 5C
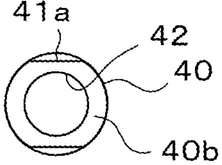

40

50
52b
52a
52
40
41a 30
60
64
50
52b
42
40
62
68

20
32
22

21
20
32
22

30
60
50
40
20
32
40a
21
34

21
32
20
22

40
21
34
32
20
40a 50
52b
52a
52
40b
41a
40

60
66
64
50
52b
42
62
68

WAFER PLACEMENT TABLE

BACKGROUND OF THE INVENTION

1. Field of the Invention

The present invention relates to a wafer placement table.

2. Description of the Related Art

In the field of semiconductor manufacturing device such as etching device and CVD device, wafer placement tables are used, which have a wafer placement surface and includes a ceramic substrate with a built-in electrode. As such a wafer placement table, for example, PTL 1 discloses a wafer placement table including a conductive embedded member electrically connected to the electrode in the ceramic substrate, and a conductive terminal with female thread electrically connected to the embedded member. A male thread of a connection member with male thread for power supply is screwed into the female thread of the terminal with female thread.

CITATION LIST

Patent Literature

PTL 1: Japanese Unexamined Patent Application Publication No. 2009-188390

SUMMARY OF THE INVENTION

However, when the wafer placement table of PTL1 is repeatedly used between a high temperature and a low temperature, the male thread of the connection member with male thread may get loose in the female thread of the terminal with female thread.

The present invention has been devised to solve such a problem, and it is a main object to prevent the male thread of the connection member with male thread from getting loose in the female thread of the terminal with female thread.

[1] A wafer placement table of the present invention includes: a ceramic substrate having a wafer placement surface and incorporating an electrode; a conductive embedded member electrically connected to the electrode; a conductive terminal with a female thread, the conductive terminal being electrically connected to the conductive embedded member, having a projection projecting from a surface, on an opposite side to the wafer placement surface, of the ceramic substrate, having the female thread at an end face of the projection; a conductive adapter that is mounted on the end face of the projection of the conductive terminal with the female thread, has a communication hole that communicates with the female thread, and is non-rotatable relative to the conductive terminal with the female thread; and a conductive connection member with a male thread, the conductive connection member having the male thread screwed into the female thread through the communication hole, and being integrated with the conductive adapter.

In the wafer placement table, the adapter is mounted on the end face of the projection of the terminal with female thread, and is non-rotatable relative to the terminal with female thread. The male thread of the connection member with male thread is screwed into the female thread of the terminal with female thread through a communication hole of the adapter. The connection member with male thread is integrated with the adapter, thus is non-rotatable relative to the terminal with female thread via the adapter. Therefore, the male thread of the connection member with male thread can be prevented from getting loose in the female thread of the terminal with female thread.

[2] In the wafer placement table (the wafer placement table according to [1]) of the present invention, the conductive adapter and the conductive connection member with the male thread are integrated with a weld zone interposed therebetween. In this manner, the adapter and the connection member with male thread can be integrated relatively easily.

[3] In the wafer placement table (the wafer placement table according to [1] or [2]) of the present invention, the conductive adapter may have a recess into which the projection of the conductive terminal with the female thread is insertable, and a cross-sectional shape of the recess may be a shape other than a circle, and a cross-sectional shape of a conductive adapter insertion section, to be inserted in the conductive adapter, of the projection may conform a cross-sectional shape of the recess. In this manner, a structure that makes the adapter non-rotatable relative to the terminal with female thread can be implemented relatively easily. Note that "the cross-sectional shape of the adapter insertion section conforms the cross-sectional shape of the recess" means that the cross-sectional shape of the adapter insertion section has a shape (shape with a gap formed between the adapter insertion section and the recess, the gap allowing the adapter insertion section to be inserted into the recess) slightly smaller than the cross-sectional shape of the recess.

[4] In the wafer placement table (the wafer placement table according to [3]) of the present invention, the cross-sectional shape of the recess may be a shape obtained by cutting a circle by one or more chords parallel to a diameter of the circle, a shape of a circumference of a circle provided with a projection, or a polygon.

[5] In the wafer placement table (the wafer placement table according to any one of [1] to [4]) of the present invention, the conductive adapter may be in contact with and not bonded to the conductive terminal with the female thread. In this manner, the adapter does not need to be bonded to the terminal with female thread, thus, the manufacturing process of the wafer placement table is simplified.

[6] In the wafer placement table (the wafer placement table according to any one of [1] to [5]) of the present invention, a material for the ceramic substrate may contain aluminum nitride as a main component, a material for the conductive embedded member and the conductive terminal with the female thread may contain molybdenum as a main component, and a material for the conductive adapter and the conductive connection member with the male thread may contain nickel as a main component. In this manner, since the thermal expansion coefficients of aluminum nitride and molybdenum are close, even when the wafer placement table is repeatedly used between a high temperature and a low temperature, it is possible to prevent the occurrence of damage between the ceramic substrate and the embedded member as well as between the ceramic substrate and the terminal with female thread. In addition, nickel has a low electrical resistance at a high temperature, a high melting point, and a high oxidation resistance, thus the adapter and the connection member with male thread can be continued to be used over a long period even in the use environment of the wafer placement table. Note that the "main component" refers to the component which has the highest mass rate among all components.

BRIEF DESCRIPTION OF THE DRAWINGS

FIGS. 5A to 5D show explanatory views of a terminal 40 with female thread.

DETAILED DESCRIPTION OF THE INVENTION

Figure 1:
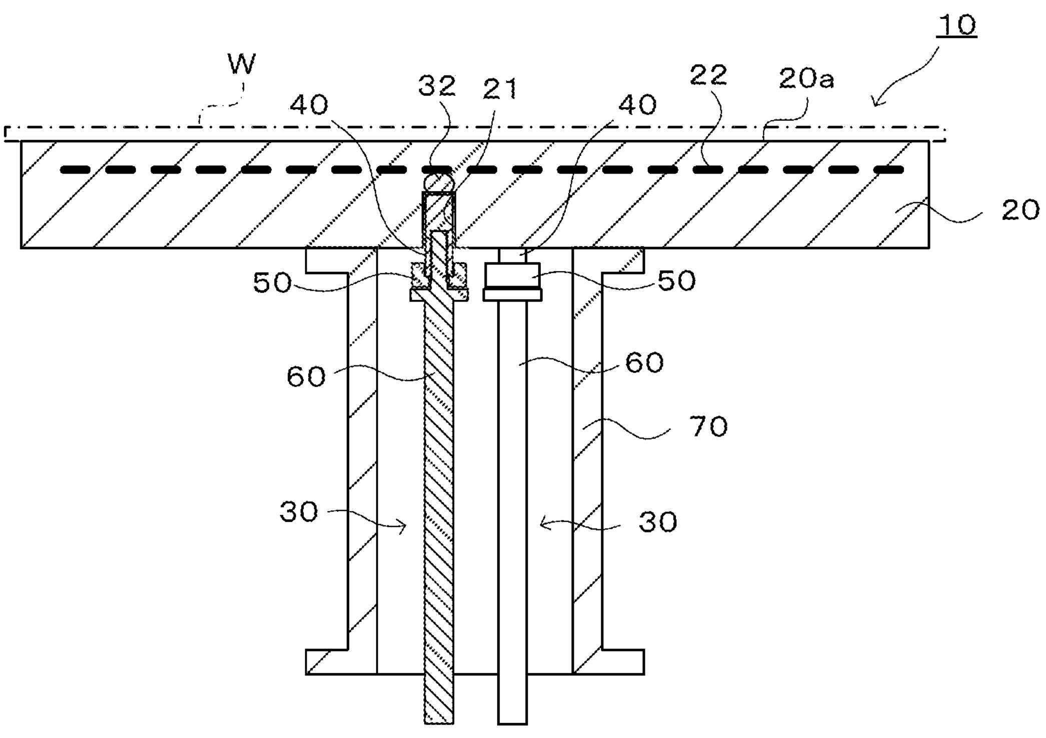
FIG. 1 is a vertical cross-sectional view of a wafer placement table 10.
Figure 2:
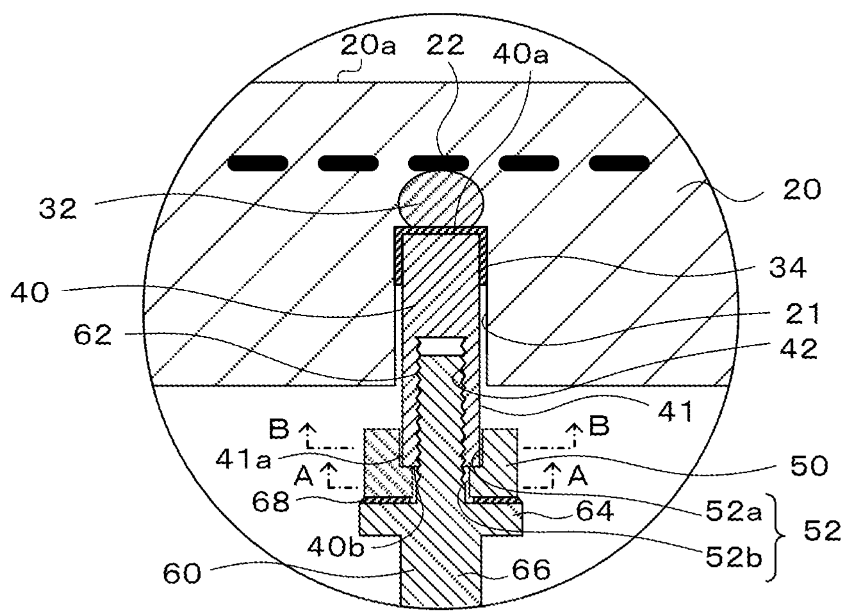
FIG. 2 is a partially enlarged view of FIG. 1.
Figure 3:
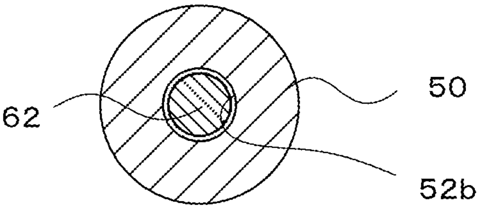
FIG. 3 is a cross-sectional view along A-A.
Figure 4:
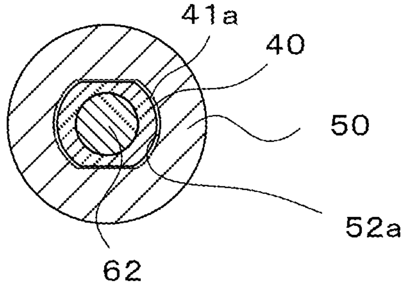
FIG. 4 is a cross-sectional view along B-B.
Figure 6A:
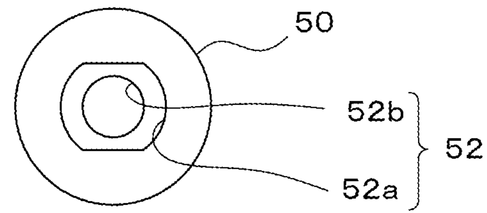
FIGS. 6A to 6C show explanatory views of an adapter 50.
Figure 6B:
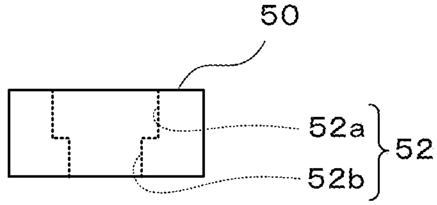
Figure 6C:
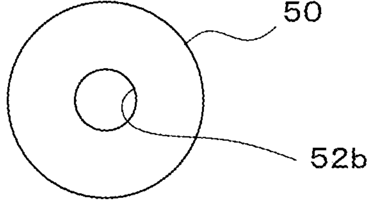

A preferred embodiment of the present invention will be described below with reference to the drawings. FIG. 1 is a vertical cross-sectional view (a cross-sectional view cut along a plane including the central axis of the wafer placement table 10) of the wafer placement table 10, FIG. 2 is a partially enlarged view of FIG. 1, FIG. 3 is a cross-sectional view along A-A, and FIG. 4 is a cross-sectional view along B-B. FIGS. 5A to 5D show explanatory views of the terminal 40 with female thread, FIG. 5A is a plan view, FIG. 5B is a front view, FIG. 5C is a bottom view, and FIG. 5D is a right side view. FIGS. 6A to 6C show explanatory views of the adapter 50, FIG. 6A is a plan view, FIG. 6B is a front view, and FIG. 6C is a bottom view.

The wafer placement table 10 is a ceramic heater used to place and heat a wafer W for performing CVD and etching, and is mounted to the inside of a chamber for a semiconductor process which is not illustrated. The wafer placement table 10 includes a ceramic substrate 20 and a hollow ceramic shaft 70.

The ceramic substrate 20 is a disc member. One surface of the ceramic substrate 20 is a wafer placement surface 20*a* on which the wafer W can be placed. A cylindrical ceramic shaft 70 is bonded to the center of the other surface (the surface on the opposite side to the wafer placement surface 20*a*) of the ceramic substrate 20. It is preferable that the material for the ceramic shaft 70 be the same as the material for the ceramic substrate 20. The ceramic substrate 20 has built-in heater electrode 22 and embedded member 32. The heater electrode 22 is a strip-shaped or coil-shaped resistance heating element wired from one end to the other end on the entire surface of the ceramic substrate 20 in a one-stroke pattern. The embedded member 32 is a conductive member electrically connected to each of one end and the other end of the heater electrode 22. The embedded member 32 is exposed to the bottom surface of a hole 21 provided from the other surface (the surface on the opposite side to the wafer placement surface 20*a*) of the ceramic substrate 20 toward the embedded member 32.

The ceramic substrate 20 has a pair of conducting assemblies 30. Each conducting assembly 30 is connected to the embedded member 32. The conducting assembly 30 passes through the inside of the ceramic shaft 70, and is connected to an external heater power source which is not illustrated so as to be able to supply electric power to the heater electrode 22 through the embedded member 32.

The conducting assembly 30 includes a terminal 40 with female thread, an adapter 50, and a connection member with male thread.

The terminal 40 with female thread is a conductive cylindrical member. As illustrated in FIG. 2, one end face of the terminal 40 with female thread is inserted in the hole 21 of the ceramic substrate 20, and is electrically connected to the embedded member 32 with a brazed bonding layer 34 interposed between the one end face 40*a* and the embedded member 32. The terminal 40 with female thread has a projection 41 projecting from a surface of the ceramic substrate 20, the surface being on the opposite side to the wafer placement surface 20*a*. An end face 40*b* of the projection 41 is provided with a female thread 42. The projection 41 of the terminal 40 with female thread is provided with an adapter insertion section 41*a* which is to be inserted into the adapter 50. The cross-sectional shape when the adapter insertion section 41*a* is cut by a horizontal plane is a shape obtained by cutting a circle by two chords with the same length parallel to a diameter of the circle (see FIG. 4 and FIGS. 5A to 5D).

The adapter 50 is a conductive disc member, and has a central hole 52 as illustrated in FIG. 2. The central hole 52 includes a recess 52*a* into which the adapter insertion section 41*a* of the terminal 40 with female thread is inserted, and a communication section 52*b* (communication hole) which communicates with the female thread 42. A step surface between the recess 52*a* of the adapter 50 and the communication section 52*b* is in contact with the end face 40*b* of the terminal 40 with female thread. The cross-sectional shape when the recess 52*a* is cut by a horizontal plane is a shape obtained by cutting a circle by two chords with the same length parallel to a diameter of the circle (see FIG. 4 and FIGS. 6A to 6C), and conforms the cross-sectional shape when the adapter insertion section 41*a* is cut by a horizontal plane. Specifically, the cross-sectional shape of the adapter insertion section 41*a* is slightly smaller than the cross-sectional shape of the recess 52*a*, and a gap is formed between the adapter insertion section 41*a* and the recess 52*a*, the gap allowing the adapter insertion section 41*a* to be inserted into the recess 52*a*. Therefore, when the recess 52*a* of the adapter is inserted into the adapter insertion section 41*a* of the terminal 40 with female thread, the adapter 50 becomes structurally non-rotatable relative to the terminal 40 female thread.

The connection member 60 with male thread is a conductive rod-like member, and has a male thread 62 at the tip end of an elongated cylindrical section 66 as illustrated in FIG. 2. The boundary between the cylindrical section 66 and the male thread 62 is provided with a flange 64. The male thread 62 is screwed into the female thread 42 of the terminal 40 with female thread through the communication section 52*b* (see FIG. 3) of the central hole 52 of the adapter 50. The surface, opposed to the adapter of the flange 64, and the adapter 50 are welded at a weld zone 68 and integrated. Therefore, the connection member 60 with male thread is unable to rotate relative to the terminal 40 with female thread with the male thread 62 screwed in the female thread 42. The weld zone 68 may be formed by electron beam welding (EBW), or formed by laser beam welding (LBW).

The material for the ceramic substrate 20 is not particularly limited, and is preferably a material including, as a main component, one kind selected from a group including aluminum nitride, alumina, silicon nitride, and boron nitride, for example.

When the ceramic substrate 20 is produced, the heater electrode 22 and the embedded member 32 are fired along with a ceramic molded body. Thus, the material for the heater electrode 22 and the material for the embedded member 32 (hereinafter referred to as the "material for the embedded member 32 and the like") is preferably a material which has substantially the same thermal expansion coefficient as that of the material for the ceramic substrate 20 and contains high-melting-point metal as the main component. The difference between the thermal expansion coefficients of the material for the embedded member 32 and the like and the material for the ceramic substrate is preferably less than or equal to 1.5 ppm/K, more preferably less than or equal to 1.0 ppm/K, and further more preferably less than or equal to 0.5 ppm/K. Preferred combinations of the main component of the material for the ceramic substrate 20 and the main component of the material for the embedded member 32 and the like are preferably aluminum nitride and molybdenum, aluminum nitride and platinum, alumina and niobium, alumina and titanium, silicon nitride and tungsten, boron nitride and tungsten, and among these, the combination of aluminum nitride and molybdenum is particularly preferable.

In the terminal 40 with female thread, it is bonded to the embedded member 32 and the ceramic substrate 20. Therefore, as the material for the terminal 40 with female thread, it is preferable to use the same material as the material for the embedded member 32. For example, when a material containing aluminum nitride as the main component is used as the material for the ceramic substrate 20, as the material for the embedded member 32 and the material for the terminal 40 with female thread, it is preferable to use a material containing molybdenum as the main component.

The material for the adapter 50 and the material for the connection member 60 with male thread are not particularly limited, however, in consideration of the use environment of the wafer placement table 10, are preferably a material containing, as the main component, metal having a low electrical resistance at a high temperature, a high melting point, and a high oxidation resistance. For example, it is preferable to use a material containing nickel as the main component.

The material for the brazed bonding layer 34 is not particularly limited, however, it is preferable to use gold braze, for example.

Next, a manufacturing example of the wafer placement table 10 will be described. FIGS. 7A to 7F show explanatory views illustrating an example of a manufacturing process of the wafer placement table 10.

Figures 7A, 7B, 7C, 7D, 7E, 7F:
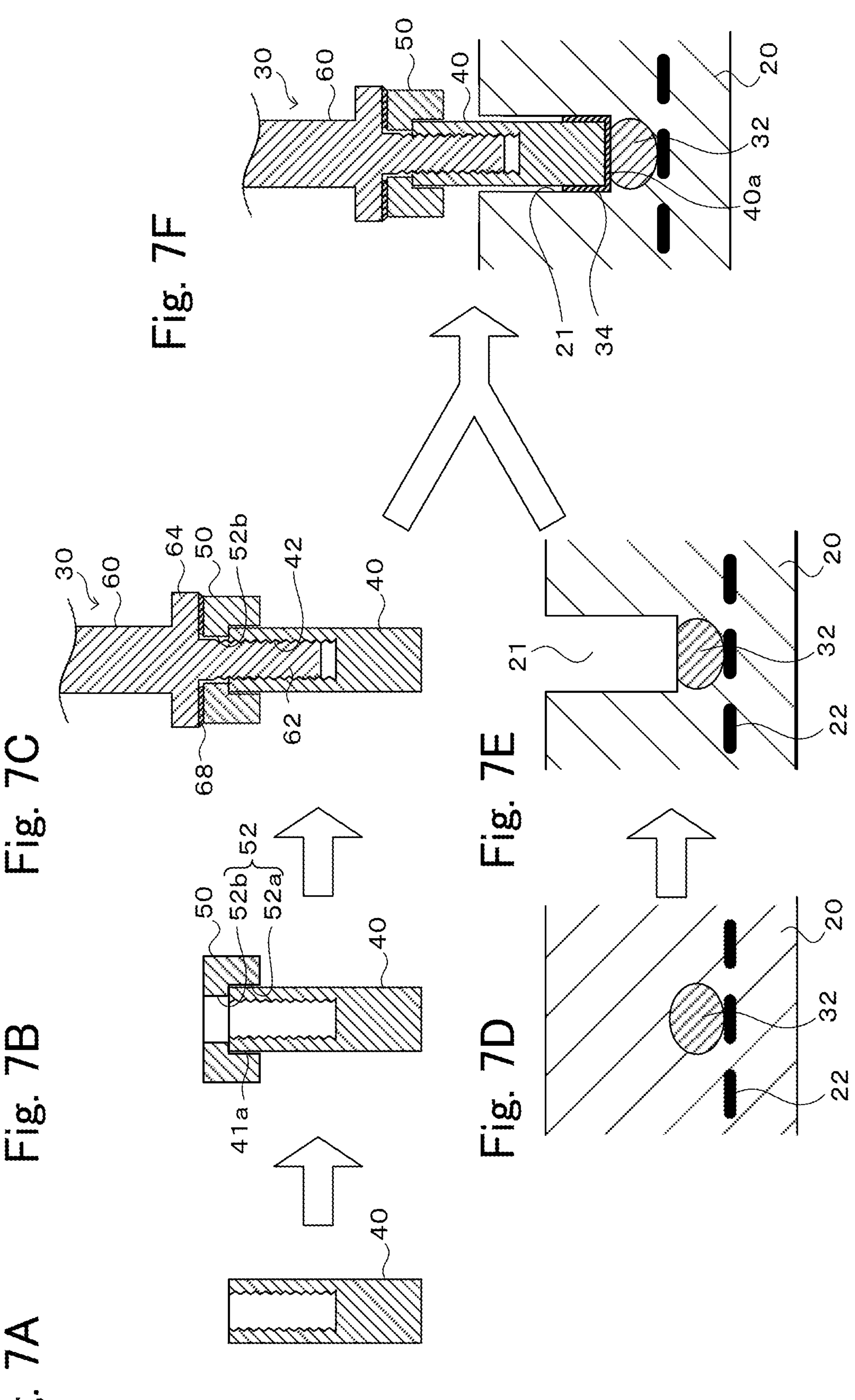
FIGS. 7A to 7F show explanatory views illustrating an example of a manufacturing process of the wafer placement table 10.

First, the terminal 40 with female thread is prepared (FIG. 7A). Next, the adapter insertion section 41*a* of the terminal 40 with female thread is inserted into the recess 52*a* of the central hole 52 of the adapter 50 (FIG. 7B). Thus, the adapter 50 is mounted on the terminal 40 with female thread with non-rotatable relative to the terminal 40 with female thread. Next, the male thread 62 of the connection member 60 with male thread is screwed into the female thread 42 of the terminal 40 with female thread through the communication section 52*b* of the central hole 52 of the adapter 50, and subsequently, the flange 64 and the adapter 50 are welded to form the weld zone 68 (FIG. 7C). Consequently, the terminal 40 with female thread, the adapter 50, and the connection member 60 with male thread are integrated to produce the conducting assembly 30.

Concurrently with this, a ceramic powder molded body with the built-in heater electrode 22 and embedded member 32 is produced, and hot press firing is performed on the molded body to produce the ceramic substrate 20 (FIG. 7D). Next, the cylindrical hole 21 is provided from a surface of the ceramic substrate 20 to the embedded member 32, the surface being on the opposite side to a surface which becomes the wafer placement surface (FIG. 7E). Thus, the embedded member 32 is exposed to the bottom surface of the hole 21. Subsequently, although not illustrated, the ceramic shaft 70 is mounted on the ceramic substrate 20.

Subsequently, a brazing material (for example, a gold brazing material) is arranged at the bottom surface of the hole 21, the end face 40*a* of the terminal 40 with female thread of the conducting assembly 30 is inserted into the hole 21 to come into contact with the brazing material, and is heated in this state, then cooled, and the terminal 40 with female thread of the conducting assembly 30 is bonded to the embedded member 32 with the brazed bonding layer 34 interposed between the terminal 40 and the embedded member 32 (FIG. 7F). Consequently, the wafer placement table 10 is obtained.

In the wafer placement table 10 described in detail above, the adapter 50 is mounted on the end face 40*b* of the projection 41 of the terminal 40 with female thread, thus is non-rotatable relative to the terminal 40 with female thread. The male thread 62 of the connection member 60 with male thread is screwed into the female thread 42 of the terminal 40 with female thread through the communication section 52*b* of the central hole 52 of the adapter 50. The connection member 60 with male thread is integrated with the adapter 50, thus is non-rotatable relative to the terminal 40 with female thread via the adapter 50. Therefore, the male thread 62 of the connection member 60 with male thread can be prevented from getting loose in the female thread 42 of the terminal 40 with female thread.

In addition, the adapter 50 and the connection member 60 with male thread are integrated via the weld zone 68. Therefore, the adapter 50 and the connection member 60 with male thread can be integrated relatively easily. In addition, the connection member 60 with male thread and the adapter 50 can be detached from the terminal 40 with female thread by cutting the weld zone 68. Thus, when some problem occurs in the connection member 60 with male thread and the adapter 50, the connection member 60 with male thread and the adapter 50 can be replaced while keeping the terminal 40 with female thread.

Furthermore, the adapter 50 has the recess 52*a* into which the projection 41 of the terminal 40 with female thread is insertable, the cross-sectional shape of the recess 52*a* is a shape other than a circle, and the cross-sectional shape of the adapter insertion section 41*a* of the terminal 40 with female thread conforms the cross-sectional shape of the recess 52*a*. Thus, a structure that makes the adapter 50 non-rotatable relative to the terminal 40 with female thread can be implemented relatively easily.

Furthermore, the recess 52*a* of the central hole 52 of the adapter 50 is in contact with and not bonded to the end face 40*b* of the terminal 40 with female thread. In other words, the adapter 50 does not need to be bonded to the terminal 40 with female thread. Therefore, the manufacturing process is simplified. Note that when the material for the adapter 50 contains nickel as the main component, and the material for the terminal 40 with female thread contains molybdenum as the main component, welding nickel and molybdenum is difficult, thus it is preferable not to weld the adapter 50 and the terminal 40 with female thread.

The material for the ceramic substrate 20 preferably contains aluminum nitride as the main component, the material for the embedded member 32 and the terminal 40 with female thread preferably contains molybdenum as the main component, and the material for the adapter 50 and the connection member 60 with male thread preferably contains nickel as the main component. In this manner, since the thermal expansion coefficients of aluminum nitride and molybdenum are close, even when the wafer placement table 10 is repeatedly used between a high temperature and a low temperature, it is possible to prevent the occurrence of damage between the ceramic substrate 20 and the embedded member 32 as well as between the ceramic substrate 20 and the terminal 40 with female thread. In addition, nickel has a low electrical resistance at a high temperature, a high melting point, and a high oxidation resistance, thus the adapter 50 and the connection member 60 with male thread can be continued to be used over a long period even in the use environment of the wafer placement table 10. When the conducting assembly 30 is braze-bonded to the embedded member 32 as in FIGS. 7A to 7F, the conducting assembly 30 has resistance to high temperature bonding using a brazing material because the conducting assembly 30 is composed of a material containing high-melting-point metal as the main component, such as molybdenum and nickel.

Note that the present invention is not limited to the above-described embodiment at all, and needless to say, as long as an embodiment belongs to the technical scope of the present invention, the embodiment can be implemented in various aspects.

Figures 8A, 8B, 8C, 8D:
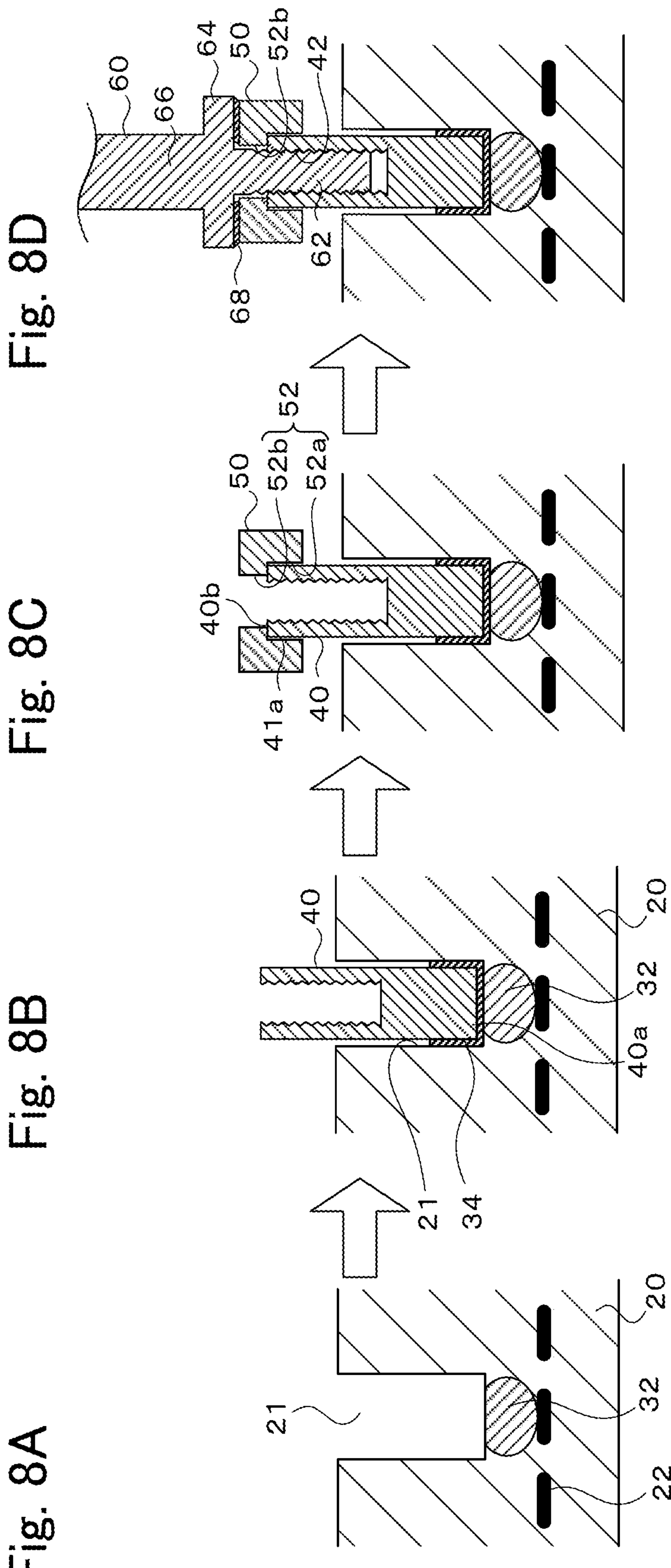
FIGS. 8A to 8D show explanatory views illustrating an example of a manufacturing process of the wafer placement table 10.

In the above-described embodiment, the manufacturing process illustrated in FIGS. 7A to 7F has been adopted, however, the manufacturing process is not particularly limited to this. For example, the manufacturing process illustrated in FIGS. 8A to 8D may be adopted. In this case, first, the cylindrical hole 21 is provided from a surface of the ceramic substrate 20 to the embedded member 32, the surface being on the opposite side to a surface which becomes the wafer placement surface (FIG. 8A (same as FIG. 7E)). Next, a brazing material (for example, a gold braze material) is arranged at the bottom surface of the hole 21, the end face 40*a* of the terminal 40 with female thread is inserted into the hole 21 to come into contact with the brazing material, and is heated in this state, then cooled, and the terminal 40 with female thread is bonded to the embedded member 32 with the brazed bonding layer 34 interposed between the terminal 40 and the embedded member 32 (FIG. 8B). Next, the adapter insertion section 41*a* of the terminal 40 with female thread is inserted into the recess 52*a* of the central hole 52 of the adapter 50 (FIG. 8C). Next, the male thread 62 of the connection member 60 with male thread is screwed into the female thread 42 of the terminal 40 with female thread through the communication section 52*b* of the central hole 52 of the adapter 50, and subsequently, the flange 64 and the adapter 50 are welded to form the weld zone 68 (FIG. 8D). Also, in this manner, the wafer placement table 10 is obtained. In this manufacturing method, the adapter 50 and the connection member 60 with male thread are not exposed to a temperature for braze-bonding, thus the material for these may contain, as the main component, metal having a melting point lower than that of nickel.

Figure 9:
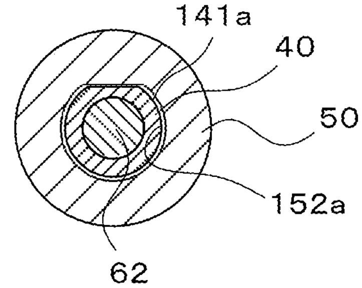
FIG. 9 is another example of a cross-sectional view along B-B.
Figure 10:
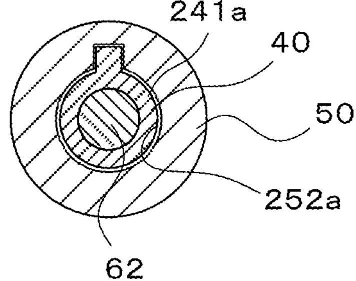
FIG. 10 is another example of a cross-sectional view along B-B.
Figure 11:
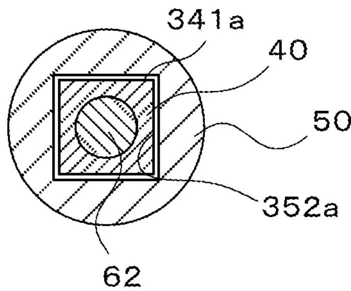
FIG. 11 is another example of a cross-sectional view along B-B.

In the above-described embodiment, the cross-sectional shape when the recess 52*a* of the adapter 50 is cut by a horizontal plane is a shape obtained by cutting a circle by two chords with the same length parallel to a diameter of the circle (see FIG. 4), however, the cross-sectional shape is not particularly limited to this. For example, as illustrated in FIG. 9, the cross-sectional shape of a recess 152*a* of the adapter 50 may be a shape obtained by cutting a circle by one chord, and the cross-sectional shape of an adapter insertion section 141*a* of the terminal with female thread may conform the shape obtained. Alternatively, as illustrated in FIG. 10, the cross-sectional shape of a recess 252*a* of the adapter 50 may be a shape obtained by providing the circumference of a circle with a projection, and the cross-sectional shape of an adapter insertion section 241*a* of the terminal 40 with female thread may conform the shape obtained. Alternatively, as illustrated in FIG. 11, the cross-sectional shape of a recess 352*a* of the adapter 50 may be a polygon (a quadrilateral herein), and the cross-sectional shape of an adapter insertion section 341*a* of the terminal with female thread may conform the polygon.

In the above-described embodiment, the connection member 60 with male thread includes the elongated cylindrical section 66; however, two conductive cylindrical bodies connected by a conductive cable may be used instead of the cylindrical section 66. The material for the cable is preferably nickel.

In the above-described embodiment, the flange 64 of the connection member 60 with male thread, and the adapter are integrated with the weld zone 68 interposed therebetween; however, the integration may be made by a braze-bonding section or by utilizing a screw instead of the weld zone 68.

In the above-described embodiment, the recess 52*a* of the central hole 52 of the adapter 50 is not bonded to the end face 40*b* of the terminal 40 with female thread, but may be bonded thereto. The bonding may be performed by welding or braze-bonding, or using a screw. For example, in the case of the adapter 50 made of nickel and the terminal with female thread made of molybdenum, welding is difficult; however, in the case of a combination of weldable metals, the metals may be welded.

In the above-described embodiment, an example has been illustrated in which the ceramic substrate 20 of the wafer placement table 10 has the built-in heater electrode 22; however, the invention is not particularly limited to this. For example, instead of or in addition to the heater electrode 22, an electrostatic electrode may be built in or an RF electrode may be built in. In addition, the ceramic shaft 70 of the wafer placement table 10 may be omitted. Alternatively, a hole vertically penetrating the ceramic substrate 20 may be provided. As such a hole, for example, a lift pin hole for inserting a lift pin to lift the wafer W placed on the wafer placement surface 20*a*, and a gas hole for supplying a gas to the back surface of the wafer W may be mentioned.

In the above-described embodiment, the ceramic substrate 20 is produced by performing hot press firing on a ceramic powder molded body; however, the molded body then may be produced by layering multiple tape molded bodies, may be produced by a mold cast method, or may be produced by compacting ceramic powder.

This application is based on the priority of Japanese Patent Application No. 2022-094256, filed Jun. 10, 2022, the entire contents of which are incorporated herein by reference.

What is claimed is:

1. A wafer placement table comprising:

a ceramic substrate having a wafer placement surface and incorporating an electrode;

a conductive embedded member electrically connected to the electrode;

a conductive terminal with a female thread, the conductive terminal being electrically connected to the conductive embedded member, having a projection projecting from a surface, on an opposite side to the wafer placement surface, of the ceramic substrate, having the female thread at an end face of the projection;

a conductive adapter that is mounted on the end face of the projection of the conductive terminal with the female thread, has a communication hole that communicate with the female thread, and is non-rotatable relative to the conductive terminal with the female thread; and a conductive connection member with a male thread, the conductive connection member having the male thread screwed into the female thread through the communication hole, and being integrated with the conductive adapter; and wherein the conductive adapter is mounted below the surface of the ceramic substrate opposite to the wafer placement surface.

2. The wafer placement table according to claim 1, wherein the conductive adapter and the conductive connection member with the male thread are integrated with a weld zone interposed therebetween.

3. The wafer placement table according to claim 1, wherein the conductive adapter has a recess into which the projection of the conductive terminal with the female thread is insertable, and a cross-sectional shape of the recess is a shape other than a circle, and a cross-sectional shape of a conductive adapter insertion section, to be inserted in the conductive adapter, of the projection conforms to the cross-sectional shape of the recess.

4. The wafer placement table according to claim 3, wherein the cross-sectional shape of the recess is a shape obtained by cutting a circle by one or more chords parallel to a diameter of the circle, a shape of a circumference of a circle provided with a projection, or a polygon.

5. The wafer placement table according to claim 1, wherein the conductive adapter is in contact with and not bonded to the conductive terminal with the female thread.

6. The wafer placement table according to claim 1, wherein a material for the ceramic substrate contains aluminum nitride as a main component, a material for the conductive embedded member and the conductive terminal with the female thread contains molybdenum as a main component, and a material for the conductive adapter and the conductive connection member with the male thread contains nickel as a main component.

* * * * *